(12) United States Patent
Shibata et al.

(10) Patent No.: US 11,627,661 B2
(45) Date of Patent: Apr. 11, 2023

(54) WIRED CIRCUIT BOARD AND IMAGING DEVICE

(71) Applicant: NITTO DENKO CORPORATION, Osaka (JP)

(72) Inventors: Shusaku Shibata, Osaka (JP); Hayato Takakura, Osaka (JP); Masaki Ito, Osaka (JP); Yoshihiro Kawamura, Osaka (JP); Shuichi Wakaki, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 23 days.

(21) Appl. No.: 17/338,130

(22) Filed: Jun. 3, 2021

(65) Prior Publication Data

US 2021/0298175 A1    Sep. 23, 2021

Related U.S. Application Data

(62) Division of application No. 16/649,825, filed as application No. PCT/JP2018/032998 on Sep. 6, 2018, now Pat. No. 11,058,002.

(30) Foreign Application Priority Data

Sep. 29, 2017   (JP) .................................. 2017-190951

(51) Int. Cl.
  *H05K 1/18*   (2006.01)
  *H05K 1/11*   (2006.01)
  (Continued)

(52) U.S. Cl.
  CPC ............. *H05K 1/181* (2013.01); *H05K 1/115* (2013.01); *H05K 3/002* (2013.01); *H05K 3/428* (2013.01);
  (Continued)

(58) Field of Classification Search
  CPC ............. H01L 2924/00; H01L 2224/97; H01L 23/49827; H01L 45/1675; H05K 1/113;
  (Continued)

(56) References Cited

U.S. PATENT DOCUMENTS 5,231,751 A   8/1993   Sachdev et al.
6,441,314 B2  8/2002   Rokugawa et al.
(Continued)

FOREIGN PATENT DOCUMENTS

CN    101102642 A    1/2008
JP    H10-125818 A   5/1998
(Continued)

OTHER PUBLICATIONS

Office Action, issued by the Japanese Patent Office dated Oct. 26, 2021, in connection with Japanese Patent Application No. 2017-190951.
(Continued)

*Primary Examiner* — Thiem D Phan
(74) *Attorney, Agent, or Firm* — Edwards Neils LLC; Jean C. Edwards, Esq.

(57) ABSTRACT

A method for producing a wired circuit board, the method including the steps of: a first step of providing an insulating layer having an opening penetrating in the thickness direction at one side surface in the thickness direction of the metal plate, a second step of providing a first barrier layer at one side surface in the thickness direction of the metal plate exposed from the opening by plating, a third step of providing a second barrier layer continuously at one side in the thickness direction of the first barrier layer and an inner surface of the insulating layer facing the opening, a fourth step of providing a conductor layer so as to contact the second barrier layer, and a fifth step of removing the metal plate by etching.

7 Claims, 6 Drawing Sheets

(51) Int. Cl.
    *H05K 3/00*               (2006.01)
    *H05K 3/42*               (2006.01)
    *H05K 3/46*               (2006.01)

(52) U.S. Cl.
    CPC ............ *H05K 3/429* (2013.01); *H05K 3/465* (2013.01); *H05K 2201/10121* (2013.01); *H05K 2201/10151* (2013.01); *Y10T 29/49155* (2015.01); *Y10T 29/5317* (2015.01)

(58) Field of Classification Search
    CPC . H05K 2201/09472; H05K 2203/0369; H05K 2203/0376; H05K 2201/0959; H05K 1/115; H05K 1/181; Y10T 29/49155; Y10T 29/49144; Y10T 29/49165; Y10T 29/5317; Y10S 148/026
    USPC .......... 29/738, 729, 739, 825, 830, 846, 847
    See application file for complete search history.

(56) References Cited

U.S. PATENT DOCUMENTS

| | | | |
|---|---|---|---|
| 6,662,442 | B1 | 12/2003 | Matsui et al. |
| 6,904,674 | B2 * | 6/2005 | Mune ............... H05K 3/205 29/841 |
| 7,745,736 | B2 | 6/2010 | Ogawa et al. |
| 7,907,801 | B2 * | 3/2011 | Kodama ............ G02B 6/138 382/129 |
| 9,723,729 | B2 | 8/2017 | Furusawa et al. |
| 2002/0108781 | A1 | 8/2002 | Mune et al. |
| 2003/0015342 | A1 | 1/2003 | Sakamoto et al. |
| 2009/0236131 | A1 | 9/2009 | Mok et al. |
| 2015/0216032 | A1 | 7/2015 | Lee |

FOREIGN PATENT DOCUMENTS

| | | |
|---|---|---|
| JP | 2001-044589 A | 2/2001 |
| JP | 2002-111174 A | 4/2002 |
| JP | 2002-124767 A | 4/2002 |
| JP | 2009-224750 A | 10/2009 |
| JP | 2011-181740 A | 9/2011 |
| JP | 2013-236107 A | 11/2013 |
| WO | 2015/098601 A1 | 7/2015 |

OTHER PUBLICATIONS

International Search Report Issued in PCT/JP2018/032998 dated Nov. 27, 2018.
Written Opinion Issued in PCT/JP2018/032998 dated Nov. 27, 2018.
Non-Final Office Action issued in U.S. Appl. No. 16/649,825 dated Dec. 4, 2020.
Office Action, issued by the Taiwanese Patent Office dated Jul. 11, 2022, in connection with Taiwanese Patent Application No. 107132938.
Office Action, issued by the State Intellectual Property Office dated Nov. 3, 2022, in connection with Chinese Patent Application No. 201880061983.6.

\* cited by examiner

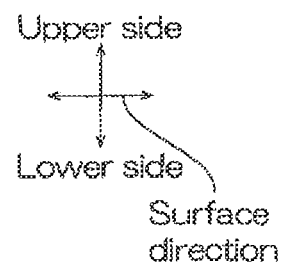
FIG. 5A
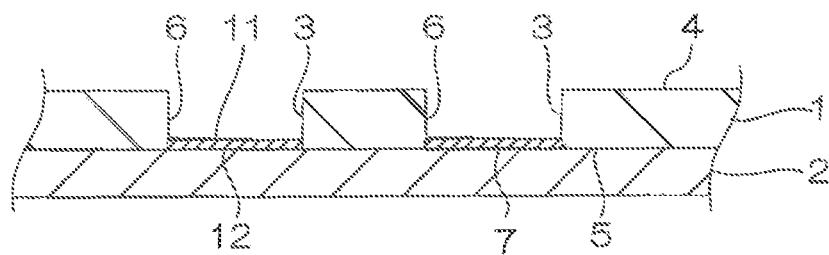
FIG. 5B
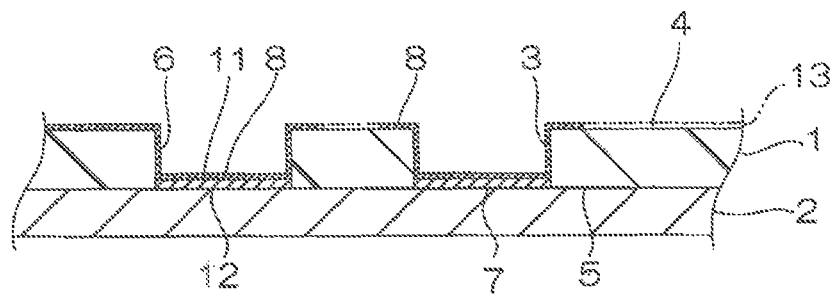
FIG. 5C
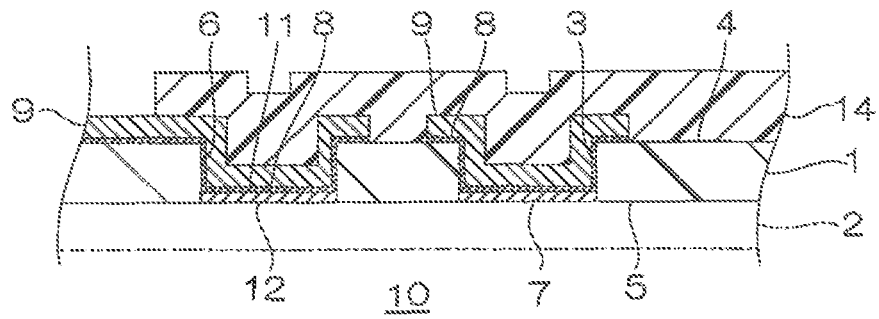

WIRED CIRCUIT BOARD AND IMAGING DEVICE

CROSS-REFERENCE TO RELATED APPLICATIONS

The present application is a Divisional of U.S. patent application Ser. No. 16/649,825, filed on Mar. 23, 2020, which is a 35 U.S.C. 371 National Stage Entry of PCT/JP2018/032998, filed on Sep. 6, 2018, which claims priority from Japanese Patent Application No. 2017-190951, filed on Sep. 29, 2017, the contents of all of which are incorporated herein by reference.

TECHNICAL FIELD

The present invention relates to a wired circuit board, producing method thereof, and imaging device. To be specific, the present invention relates to a method for producing a wired circuit board, a wired circuit board produced by the method, and an imaging device including the wired circuit board.

BACKGROUND ART

Patent Document 1 below has proposed a method below for a method for producing a substrate for a semiconductor device (ref: Patent Document 1). First, an insulating layer with a hole is formed on a copper alloy surface, and then a Au layer is formed on the copper alloy surface in the hole. Thereafter, a nickel layer is formed on the Au layer in the hole, and then the copper layer is formed on the nickel layer in the hole. Thereafter, the copper alloy is removed by etching.

In the method described in Patent Document 1, the Au layer works as the etching stopper layer, and only the copper alloy is removed. Therefore, damages to the copper layer are prevented.

CITATION LIST

Patent Document

Patent Document 1: Japanese Unexamined Patent Publication No. H10-125818

SUMMARY OF THE INVENTION

Problem to be Solved by the Invention

However, with the method described in Patent Document 1, the nickel layer is not the etching stopper layer, and therefore entrance of the etching liquid may not be prevented just with the Au layer.

The etching may enter from between the peripheral end edge of the Au layer and the inner surface of the insulating layer facing the hole.

In these cases, there are disadvantages in that the copper layer may be damaged by the etching liquid.

The present invention provides a method for producing a wired circuit board by which entrance of the etching liquid into the opening can be sufficiently suppressed at the time of etching, and damages to the conductor layer can be sufficiently suppressed; a wired circuit board produced by the method; and an imaging device.

Means for Solving the Problem

The present invention (1) includes a method for producing a wired circuit board, the method including: a first step of providing an insulating layer having an opening penetrating in the thickness direction at one side surface in the thickness direction of the metal plate; a second step of providing a first barrier layer at one side surface in the thickness direction of the metal plate exposed from the opening by plating; a third step of providing a second barrier layer continuously at one side in the thickness direction of the first barrier layer and an inner surface of the insulating layer facing the opening; a fourth step of providing a conductor layer so as to contact the second barrier layer; and a fifth step of removing the metal plate by etching.

With this production method, the first barrier layer is provided in the second step, and the second barrier layer is provided in the third step, and therefore even if the metal plate is subjected to etching in the fifth step, the two barrier layers can sufficiently suppress entrance of the etching liquid into the conductor layer.

With this production method, the second barrier layer is provided continuously in the third step at one side in the thickness direction of the first barrier layer, and the inner surface of the insulating layer facing the opening. Therefore, in the fifth step, even if the etching liquid enters into the peripheral end edge of the first barrier layer and the inner surface of the insulating layer, the second barrier layer suppresses the further entrance of the etching liquid reliably.

As a result, damages to the conductor layer can be sufficiently suppressed.

The present invention (2) includes the method for producing a wired circuit board described in (1), wherein in the third step, the second barrier layer is provided at one side surface in the thickness direction of the first barrier layer.

With this production method, in the third step, the second barrier layer is provided at one side surface in the thickness direction of the first barrier layer, and therefore the second barrier layer can contact the first barrier layer in the opening. Therefore, the two barrier layers making contact with each other can improve the effects of suppressing the entrance of the etching liquid.

The present invention (3) includes the method for producing a wired circuit board described in (1) or (2), wherein in the third step, the second barrier layer is further provided at one side surface in the thickness direction of the insulating layer surrounding the opening.

Even if the etching liquid tries to enter the one side in the thickness direction along the inner surface of the insulating layer, with this production method, by the second barrier layer provided at the one side surface in the thickness direction of the insulating layer surrounding the opening, further entrance of the etching liquid to one side in the thickness direction can be suppressed.

The present invention (4) includes the method for producing a wired circuit board described in any one of (1) to (3), wherein in the first step, the opening is provided so that the inner surface of the insulating layer has a tapered shape inclining relative to the thickness direction.

With this production method, in the first step, the opening is provided so that the inner surface of the insulating layer has a tapered shape inclining relative to the thickness direction, and therefore the inner surface of the insulating layer can be longer compared with a straight shape inner surface. Therefore, the contact area between the second barrier layer provided in the third step and the inner surface of the insulating layer can be increased to improve the effects of suppressing the entrance of the etching liquid in the fifth step with the second barrier layer.

The present invention (5) includes the method for producing a wired circuit board described in any one of (1) to (4), wherein in the third step, the second barrier layer is formed by sputtering.

With this production method, the third step can be conducted by sputtering, and therefore the second barrier layer can be easily formed.

In particular, when the inner surface of the insulating layer has a tapered shape, the second barrier layer can be reliably formed on the inner surface by sputtering.

The present invention (6) includes the method for producing a wired circuit board described in any one of (1) to (5), wherein a material of the second barrier layer is chromium.

With this production method, the material for the second barrier layer is chromium, and therefore entrance of the etching liquid in the fifth step can be reliably suppressed.

The present invention (7) includes the method for producing a wired circuit board described in any one of (1) to (5), wherein the conductor layer has a thickness of 12 μm or less.

When the conductor layer has a thickness of 12 μm or less, in the fifth step, damages to the conductor layer due to corrosion of the etching liquid may greatly affect connection reliability.

However, with the present invention, the second barrier layer is provided in the third step, and therefore even if the metal plate is subjected to etching in the fifth step, entrance of the etching liquid to the conductor layer can be sufficiently suppressed, and therefore the above-described effects can be eliminated.

The present invention (8) includes a wired circuit board including an insulating layer having an opening penetrating in the thickness direction; a first barrier layer positioned at the other end edge in the thickness direction of the opening and flush with the other side surface in the thickness direction of the insulating layer; a second barrier layer disposed continuously at one side in the thickness direction of the first barrier layer, the inner surface of the insulating layer facing the opening, and one side surface in the thickness direction of the insulating layer surrounding the opening; and a conductor layer disposed at one side surface in the thickness direction of the second barrier layer.

In the wired circuit board, even if a stress is applied to the conductor layer in a direction crossing the thickness direction, it can be spread over the insulating layer from the inner surface through the second barrier layer. Therefore, strength of the conductor layer can be improved.

The present invention (9) includes the wired circuit board described in (8), wherein the inner surface of the insulating layer has a tapered shape inclining relative to the thickness direction.

The inner surface of the insulating layer has a tapered shape inclining relative to the thickness direction, and therefore the above-described stress can be spread even more efficiently in the above-described direction.

The present invention (10) includes the wired circuit board described in (8) or (9), wherein the conductor layer has a thickness of 12 μm or less.

With this wired circuit board, the conductor layer has a small thickness of 12 μm or less, and therefore a small thickness and a low elasticity can be achieved.

The present invention (11) includes an imaging device including the wired circuit board described in (8) to (10), and an imaging element mounted on the wired circuit board, and electrically connected with the conductor layer.

The imaging device includes the above-described wired circuit board, and therefore has excellent reliability.

Effects of the Invention

With the method for producing a wired circuit board of the present invention, damages to the conductor layer can be sufficiently suppressed.

The wired circuit board of the present invention allows for improvement in strength of the conductor layer.

The imaging device of the present invention has excellent reliability.

BRIEF DESCRIPTION OF THE DRAWINGS

FIG. 5A to FIG. 5C show a modified example of the embodiment shown in FIG. 1A to FIG. 1F, corresponding to FIG. 1B to FIG. 1F, FIG. 5A illustrating a first step, in which an insulating layer having a straight-shaped opening is formed, and a second step, in which a first barrier layer is formed, FIG. 5B illustrating a third step, in which a second barrier layer (continuous layer) is formed, FIG. 5C illustrating a fourth step, in which a conductor layer is formed, a sixth step, in which an insulating cover layer is formed, and a fifth step, in which a metal plate is removed.

DESCRIPTION OF THE EMBODIMENTS

In FIG. 1A to FIG. 1F, up-down direction on the sheet surface is up-down direction (an example of thickness direction), upper side on the sheet surface is upper side (an example of one side in the thickness direction), and lower side on the sheet surface is lower side (an example of the other side in thickness direction). Left-right direction on the sheet surface is surface direction (an example of direction orthogonal to thickness direction).

To be specific, the directions are based on the direction arrows in the figures.

These definitions of the directions are not intended to limit the orientation of the wired circuit board 1 and imaging device 22 (FIG. 2)(described later) at the time of production and use.

In the following figures, the angles and size of the members are depicted with exaggeration for easier understanding of the present invention, and may not be depicted precisely.

Figure 2:
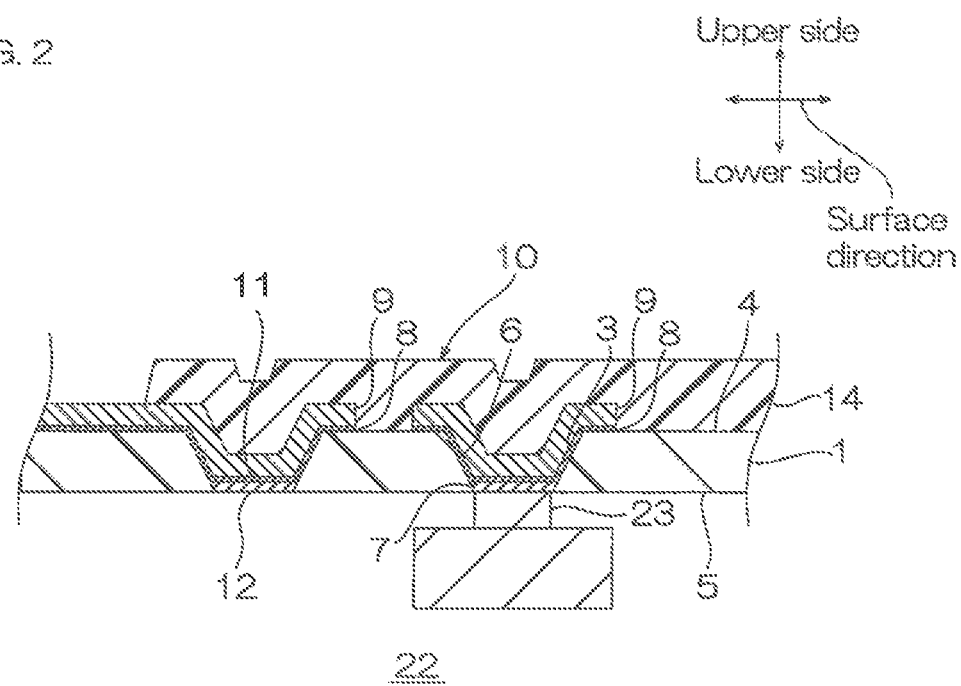
FIG. 2 shows a schematic cross-sectional view of an imaging device including the wired circuit board shown in FIG. 1F.

The embodiment of the method for producing a wired circuit board of the present invention, as shown in FIG. 2, is a method for producing a wired circuit board 10 (wired circuit board for an imaging device) to be electrically connected with an imaging element 21, and included (incorporated) in an imaging device 22.

As shown in FIG. 1A to FIG. 1E, the method for producing a wired circuit board 10 includes a first step, in which an insulating base layer 1 as an example of the insulating layer is provided on a metal plate 2; a second step, in which a first barrier layer 7 is provided; a third step, in which a second barrier layer 8 is provided; a fourth step, in which a conductor layer 9 is provided; a sixth step, in which an insulating cover layer 14 is provided; and a fifth step, in which the metal plate 2 is subjected to etching to be removed.

Figure 1A:
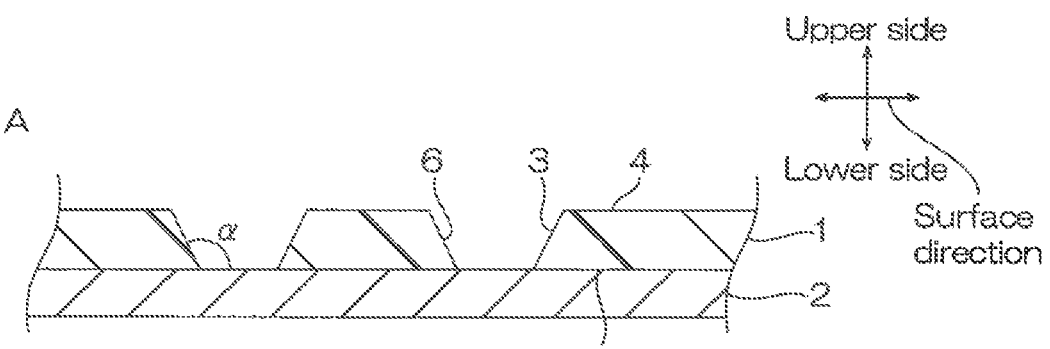
FIG. 1A to FIG. 1F are a process diagram illustrating an embodiment of the method for producing a wired circuit board of the present invention, FIG. 1A illustrating a first step, in which an insulating base layer is provided on a metal plate, FIG. 1B illustrating a second step, in which a first barrier layer is provided, FIG. 1C illustrating a third step, in which a continuous layer is provided, FIG. 1D illustrating a fourth step, in which a conductor layer is provided, FIG. 1E illustrating a step in which an insulating cover layer is provided, and FIG. 1F illustrating a fifth step, in which the metal plate is subjected to etching to be removed.

As shown in FIG. 1A, in the first step, an insulating base layer 1 having an opening 3 penetrating in thickness direction is provided on the upper face of the metal plate 2.

The insulating base layer 1 has a sheet form extending in the surface direction. The insulating base layer 1 has an insulating upper face 4 and an insulating lower face 5 that are parallel to each other. The insulating upper face 4 and the insulating lower face 5 both have a flat surface. The insulating lower face 5 is in contact with the upper face of the metal plate 2. The insulating base layer 1 has an insulating inner surface 6 facing the opening 3.

The opening 3 is disposed in a plural number in spaced apart relation from each other in the surface direction. The plurality of openings 3 each has a generally circular shape in plan view. The plurality of openings 3 each has a tapered shape with its cross-sectional opening area (cross-sectional opening area across surface direction) gradually becoming smaller toward the lower side. Therefore, the insulating inner surface 6 is a tapered face (inclined face) facing each other in surface direction when seen in cross-sectional view (when cut in thickness direction), and is formed so that their facing distance decrease toward lower side. That is, the opening 3 has a generally truncated cone shape with its diameter decreasing toward lower side. The lower end edge of the opening 3 is closed by the metal plate 2.

Examples of the material for the insulating base layer 1 include insulating materials. Examples of the insulating material include synthetic resin such as polyimide, polyamide-imide, acrylic materials, polyether nitrile, polyether sulfone, polyethylene terephthalate, polyethylene naphthalate, and polyvinyl chloride. Preferably, polyimide is used.

The metal plate 2 has a sheet form extending in surface direction and has a flat upper face. For the material of the metal plate 2, for example, materials that are removed by etching in the fifth step (FIG. 1F)(described later), or conductors that are to be a feeding layer in plating (To be specific, electrolytic plating) in the second step (described later) are used. The metal plate 2 is to be a support layer that supports the first barrier layer 7, second barrier layer 8, conductor layer 9, and insulating cover layer 14 to be describe later, and therefore examples of material for the metal plate 2 include materials having rigidity. To be specific, examples of the material for the metal plate 2 include metals such as stainless steel, 42 alloy, aluminum, and copper alloy, and preferably, stainless steel is used. The metal plate 2 has a thickness of, for example, 5 μm or more, preferably 10 μm or more, and for example, 50 μm or less, preferably 30 μm or less.

In the first step, the insulating base layer 1 is provided on, for example, the upper face of the metal plate 2 by photoprocessing. To be specific, first, a photosensitive insulating composition containing a photosensitive component and an insulating material is prepared, and then the photosensitive insulating composition is applied to the upper face of the metal plate 2, and thereafter, as necessary, it is dried to form a coating. Then, the coating was exposed to light through a photomask having a pattern corresponding to the opening 3, and developed, and thereafter, as necessary, it is heated after exposure to light. The insulating inner surface 6 having a tapered shape is formed by adjusting the parallelism of light with exposure gap at the time of exposure.

Alternatively, the insulating base layer 1 formed into a pattern having an opening 3 is disposed (placed) on the upper face of the metal plate 2.

In this manner, the insulating base layer 1 having the opening 3 is formed on the upper face of the metal plate 2.

The insulating base layer 2 has a thickness of, for example, 1 μm or more, preferably 5 μm or more, and for example, 30 μm or less, preferably 10 μm or less.

The upper end edge of the opening 3 has a maximum length (maximum diameter) of, for example, 10 μm or more, preferably 50 μm or more, and for example, 2000 μm or less, preferably 1500 μm or less. The lower end edge of the opening 3 has a maximum length (maximum diameter) of, for example, 5 μm or more, preferably 30 μm or more, and for example, 500 μm or less, preferably 200 μm or less.

The angle α formed by the insulating inner surface 6 and the upper face of the metal plate 2 exposed from the opening 3 is, for example, wide, to be specific, more than 90 degrees, preferably 120 degrees or more, and for example, 170 degrees or less, preferably 160 degrees or less.

Figure 1B:
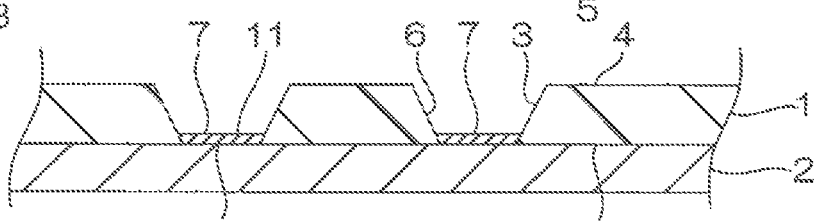

As shown in FIG. 1B, then, in the second step, the first barrier layer 7 is provided on the upper face of the metal plate 2 exposed from the opening 3 by plating.

The first barrier layer 7 is a barrier layer for the etching liquid in the fifth step, positioned at the lower end edge in the opening 3, and is in a film form extending in the surface direction in the opening 3. The peripheral end edge of the first barrier layer 7 is in contact with the lower end edge of the insulating inner surface 6. The first barrier layer 7 has a first upper face 11 and a second lower face 12 that are parallel to each other and disposed in spaced apart relation in thickness direction.

The second lower face 12 is in contact with the upper face of the metal plate 2, and flush with the insulating lower face 5 in surface direction. That is, the second lower face 12 is continuous with the insulating lower face 5 in surface direction.

The first upper face 11 overlaps with the insulating inner surface 6 when projected in surface direction, and is positioned at the lower side of the insulating upper face 4 in spaced apart relation.

Examples of the material of the first barrier layer 7 include a material having etching barrier characteristics, i.e., a material that can suppress entrance of the etching liquid in etching (described later) of the fifth step. To be specific, gold, platinum, palladium, chromium, and alloys thereof are used, and preferably, gold is used.

The first barrier layer 7 is provided by, for example, electrolytic plating, or electroless plating. Preferably, the first barrier layer 7 is formed on the upper face of the metal plate 2 exposed from the opening 3 by electrolytic plating with electricity supplied from the metal plate 2.

The first barrier layer 7 has a thickness of, for example, 0.05 μm or more, preferably 0.2 μm or more, and for example, 20 μm or less, preferably 5 μm or less.

Figure 1C:
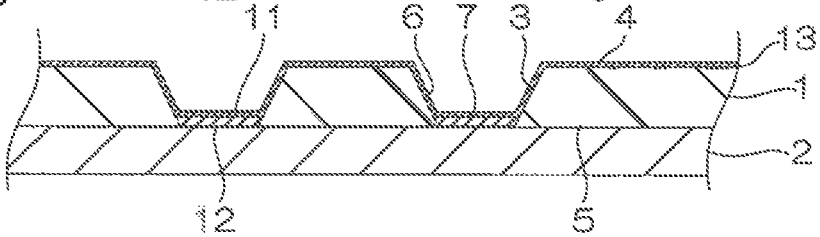

As shown in FIG. 1C, then, in the third step, the second barrier layer 8 is provided continuously on the first upper face 11 of the first barrier layer 7, insulating inner surface 6, and the insulating upper face 4 of the insulating layer 1 surrounding the opening 3.

To be specific, first, the continuous layer 13 including the second barrier layer 8 is provided continuously on the entire face of the first upper face 11 of the first barrier layer 7, and the entire face of the insulating inner surface 6 and insulating upper face 4 of the insulating layer 1.

The continuous layer 13 is continuous with the above-described insulating inner surface 6 and first upper face 11. In this manner, the continuous layer 13 blocks the external face (external side face of the insulating inner surface 6) of the peripheral end edge of the first upper face 11, and the lower end edge of the insulating inner surface 6.

Furthermore, the continuous layer 13 is disposed at the entire face other than its lower end edge in the insulating inner surface 6, and covers (blocks) the entire face.

The continuous layer 13 has a thin film form extending continuously along the above-described faces, and conforms to the above-described faces, and has the same thickness in the direction orthogonal to the direction the continuous layer 13 extends.

Figure 1D:
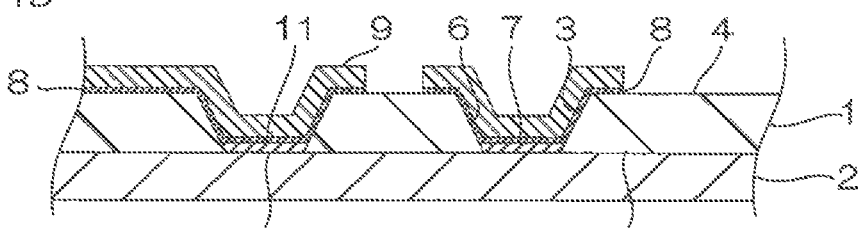

The continuous layer 13 is a layer to be (formed into) the second barrier layer 8 by patterning in the fourth step (ref: FIG. 1D) to be described later, has the same thickness as that of the second barrier layer 8, and made of the same material.

Examples of the material for the continuous layer 13 include a material having etching barrier characteristics, i.e., a material that can suppress further entrance of the etching liquid passing through the first barrier layer 7 by etching (described later) in the fifth step, and an adherence material that improves adherence to the insulating layer 1 of the conductor layer 9 (that is, material having greater adherence to the insulating layer 1 of the continuous layer 13 and the conductor layer 9 of the continuous layer 13 compared with the insulating layer 1 of the conductor layer 9) is used. For the material for the continuous layer 13, because the second barrier layer 8 is to be a base layer (seed layer, seed film) in plating in the fourth step to be described later, conductor is used.

Examples of the material for the continuous layer 13 include the same or different material for the material of the first barrier layer 7. When the material for the continuous layer 13 is different from the material for the first barrier layer 7, a boundary is formed between them, and when the material for the continuous layer 13 is the same as the material for the first barrier layer 7, a boundary due to the difference of the forming method is formed. Preferably, the material for the continuous layer 13 is different from the material for the first barrier layer 7, and to be specific, chromium is used. When the material for the continuous layer 13 is chromium, in the etching (described later) of the fifth step, further entrance of the etching liquid that has passed through the first barrier layer 7 can be suppressed even more, and adherence to the insulating layer 1 of the conductor layer 9 can be sufficiently improved.

The continuous layer 13 is formed, for example, by a thin-film forming method such as sputtering, and plating (electroless plating, etc.). Preferably, it is formed by sputtering. With sputtering, a continuous layer 13 having a homogenous thickness can be formed easily.

The continuous layer 13 has a thickness of, for example, 5 nm or more, preferably 10 nm or more, and for example, 500 nm or less, preferably 100 nm or less.

Thereafter, in the fourth step, the continuous layer 13 is subjected to patterning (unnecessary portion of the continuous layer 13 is removed), and only the second barrier layer 8 remains (formed).

As shown in FIG. 1D, then, in the fourth step, the conductor layer 9 is provided so as to contact the continuous layer 13.

The conductor layer 9 is formed on the upper face of the continuous layer 13 into a pattern that overlaps with the second barrier layer 8 to be patterned later on in plan view.

The conductor layer 9 is formed, for example, by a pattern forming method such as additive method, and subtractive method.

Preferably, the conductor layer 9 is formed on the upper face of the continuous layer 13 by additive method. To be specific, first, a plating resist, which is not shown, is disposed as a reverse pattern of the conductor layer 9 on the upper face of the continuous layer 13, and then electricity is supplied to the continuous layer 13 through the first barrier layer 7 from the metal plate 2 to form the conductor layer 9 by electrolytic plating. That is, the continuous layer 13 is used as a seed film (seed layer) to conduct electrolytic plating.

Thereafter, the plating resist is removed, and then the continuous layer 13 (continuous layer 13 exposed from conductor layer 9, that is, unnecessary portion of the continuous layer 13) covered with the plating resist is removed by, for example, peeling.

In this manner, the conductor layer 9 is formed, and the second barrier layer 8 is formed.

The second barrier layer 8 is formed into a continuous pattern at the first upper face 11 of the first barrier layer 7, the insulating inner surface 6 (lower end edge), and the insulating upper face 4 surrounding the opening 3.

The conductor layer 9 is in contact with the upper face of the second barrier layer 8, and in plan view, formed into the same pattern as that of the second barrier layer 8.

For the material of the conductor layer 9, for example, conductors such as copper, nickel, or alloys, and preferably, copper is used.

The conductor layer 9 has a thickness of, for example, 0.5 μm or more, preferably 2 μm or more, and for example, 20 μm or less, preferably 12 μm or less, more preferably 8 μm or less, even more preferably 5 μm or less, particularly preferably 3 μm or less.

When the conductor layer 9 has a thickness of the above-described upper limit or less, the wired circuit board 10 can be thin. Furthermore, the modulus of elasticity of the wired circuit board 10 decreases, and therefore low-warping can be achieved with the imaging device 22.

Figure 1E:
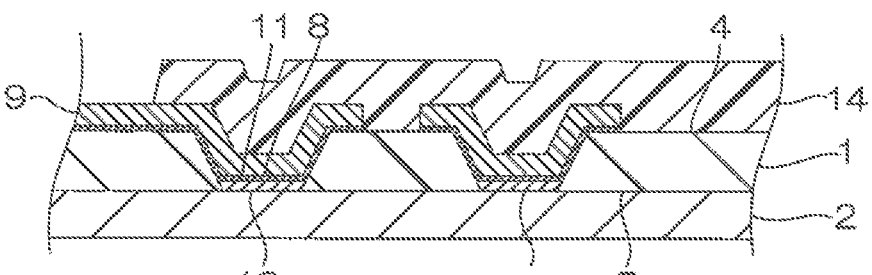

As shown in FIG. 1E, in the sixth step, then, the insulating cover layer 14 is provided on the insulating upper face 4 so as to partly cover the conductor layer 9. For example, the insulating cover layer 14 is formed from the same insulating material as that of the insulating base layer 1 by, for example, photoprocessing. The thickness of the insulating cover layer 14 is not particularly limited, and for example, 1 µm or more, preferably 3 µm or more, and for example, 30 µm or less, preferably 10 µm or less.

Figure 1F:
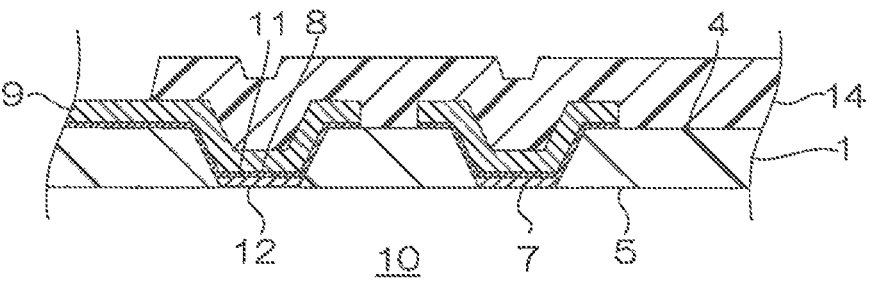

As shown in FIG. 1F, thereafter, in the fifth step, the metal plate 2 is removed by etching.

To be specific, the etching resist (not shown) is disposed to cover the conductor layer 9, and then the metal plate 2 is exposed to the etching liquid.

The types of the etching liquid, and etching conditions are not particularly limited, and for example, they are suitably set so that it can remove the metal plate 2 but not the insulating base layer 1 and the first barrier layer 7.

In this manner, the wired circuit board 10 is produced. The wired circuit board 10 includes the insulating base layer 1, first barrier layer 7, second barrier layer 8, conductor layer 9, and insulating cover layer 14. Preferably, the wired circuit board 10 is composed only of the insulating base layer 1, first barrier layer 7, second barrier layer 8, conductor layer 9, and insulating cover layer 14.

The wired circuit board 10 has a thickness of, for example, 50 µm or less, preferably 40 µm or less, and for example, 1 µm or more, preferably 5 µm or more.

As shown in FIG. 2, next, description is given below of an imaging device 22 including the above-described wired circuit board 10.

An imaging element 21 is prepared at a lower side of the wired circuit board 10, and then a terminal 23 of the imaging element 21 is brought into contact with the first barrier layer 7. In this manner, the terminal 23 of the imaging element 21 is electrically connected with the conductor layer 9 through the first barrier layer 7 and the second barrier layer 8. In this manner, the imaging element 21 is mounted on the wired circuit board 10.

The wired circuit board 10 and the imaging device 22 including the imaging element 21 is produced in this manner.

With this production method, in the second step shown in FIG. 1B, the first barrier layer 7 is provided, and in the third step shown in FIG. 1C, the continuous layer 13 to be the second barrier layer 8 is provided. Therefore, even if the metal plate 2 is subjected to etching in the fifth step shown in FIG. 1F, with the two barrier layers (first barrier layer 7 and second barrier layer 8), entrance of the etching liquid into the conductor layer 9 can be sufficiently suppressed.

With this production method, in the third step as shown in FIG. 1C, the continuous layer 13 to be the second barrier layer 8 is provided continuously at the first upper face 11 (upper side of the first barrier layer 7) of the first barrier layer 7 and the insulating inner surface 6 of the insulating layer 1. Therefore, in the fifth step, even if the etching liquid enters between the peripheral end edge of the first barrier layer 7 and the insulating inner surface 6 of the insulating layer 1, the second barrier layer 8 can reliably suppress further entrance of the etching liquid.

As a result, damages to the conductor layer 9 can be sufficiently suppressed.

With this production method, in the third step shown in FIG. 1C, the continuous layer 13 to be the second barrier layer 8 is provided at the first upper face 11 of the first barrier layer 7, and therefore the second barrier layer 8 can directly contact the first barrier layer 7. Therefore, effects of suppressing the entrance of the etching liquid to the opening 3 that are contacting each other with the two barrier layers can be improved.

Even if the etching liquid tries to enter upward along the insulating inner surface 6 of the insulating layer 1, with this production method, with the second barrier layer 8 provided at the insulating upper face 4 of the insulating layer 1 surrounding the opening 3, further entrance of the etching liquid to the upper side can be suppressed.

With this production method, as shown in FIG. 1A, in the first step, the opening 3 is provided so that the insulating inner surface 6 of the insulating layer 1 have a tapered shape inclining relative to the thickness direction. Therefore, the insulating inner surface 6 of the insulating base layer 1 can be made longer compared with a straight shaped insulating inner surface 6 (ref: FIG. 5A).

Therefore, contact area between the continuous layer 13 to be the second barrier layer 8 provided in the third step in FIG. 1C and the insulating inner surface 6 of the insulating base layer 1 can be increased, and with the second barrier layer 8 formed from the continuous layer 13, the effects of suppressing entrance of the etching liquid in the fifth step can be improved.

In the third step shown in FIG. 1C, the second barrier layer 8 is reliably provided at the insulating inner surface 6 of the insulating layer 1.

With this production method, as shown in FIG. 1C, when the third step is conducted by sputtering, the continuous layer 13 to be the second barrier layer 8 can be easily formed.

In particular, when the insulating inner surface 6 of the insulating base layer 1 has a tapered shape, the continuous layer 13 can be reliably formed relative to the insulating inner surface 6 by sputtering.

Furthermore, when the material of the second barrier layer is chromium, entrance of the etching liquid in the fifth step can be reliably suppressed.

When the conductor layer 9 has a small thickness of 12 µm or less, in the fifth step, without the first barrier layer 1 and second barrier layer 8, damages to the conductor layer 9 due to erosion by the etching liquid leads to decrease in connection reliability. To be specific, a thin conductor layer 9 causes damages such as piercing.

However, with this production method, the second barrier layer 8 is provided in the third step, and therefore even if the metal plate 2 is subjected to etching in the fifth step, entrance of the etching liquid to the conductor layer 9 can be sufficiently suppressed, and therefore, the above-described damages can be suppressed.

Meanwhile, when the conductor layer 9 has a thickness of more than 8 µm, the above-described piercing is less likely to occur.

With the wired circuit board 1, even if the stress is applied in the surface direction to the conductor layer 9, it can be spread over the insulating layer 1 from the insulating inner surface 6 through the second barrier layer 8. Therefore, strength of the conductor layer 9 can be improved.

Furthermore, the insulating inner surface 6 of the insulating layer 1 has a tapered shape, and therefore the above-described stress can be spread in the surface direction even more efficiently.

When the conductor layer 9 has a small thickness of 12 µm or less, the wired circuit board 1 can be made thin. Furthermore, the modulus of elasticity of the wired circuit board 10 decreases, and therefore the imaging device 22 can achieve low warping.

The imaging device 22 shown in FIG. 2 includes the above-described wired circuit board 1, and therefore it has excellent reliability.

[Modified Example]

In the modified example below, for the members and steps that are the same as the first embodiment, the same reference numerals are given and detailed descriptions thereof are omitted. These modified examples can be suitably combined. Furthermore, the modified examples have the same operations and effects as those in the embodiment unless otherwise noted.

Figure 3:
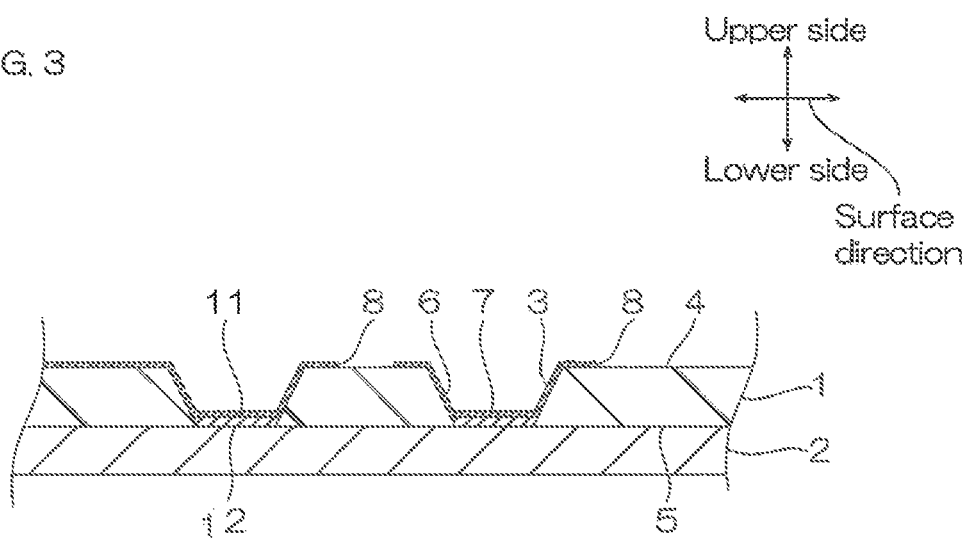
FIG. 3 is a modified example of the embodiment shown in FIG. 1A to FIG. 1F, showing the third step corresponding to FIG. 1C, in which the second barrier layer is formed into a predetermined pattern in advance.

In the first embodiment, as shown in FIG. 1C, the continuous layer 13 is formed on the entire insulating layer 1, and then as shown in FIG. 1D, at the same time with the formation of the conductor layer 9, the second barrier layer 8 is patterned from the continuous layer 13. However, as shown in FIG. 3, for example, the second barrier layer 8 having a predetermined pattern can be formed continuously on the first upper face 11 of the first barrier layer 7, the insulating inner surface 6, and the insulating upper face 4 of the insulating layer 1 of the surrounding of the opening 3.

Thereafter, as shown in FIG. 1D, the conductor layer 9 is formed on the upper face of the second barrier layer 8, and then as shown in FIG. 1E, the insulating cover layer 14 is formed, and as shown in FIG. 1F, the metal plate 2 is removed.

In the first embodiment, as shown in FIG. 1D, the second barrier layer 8 is provided at the insulating upper face 4 of the insulating layer 1 surrounding the opening 3. However, for example, as shown in FIG. 4A, the insulating upper face 4 of the insulating layer 1 surrounding the opening 3 is exposed, and it can be provided only on the first upper face 11 of the first barrier layer 7, and the insulating inner surface 6.

Figure 4A:
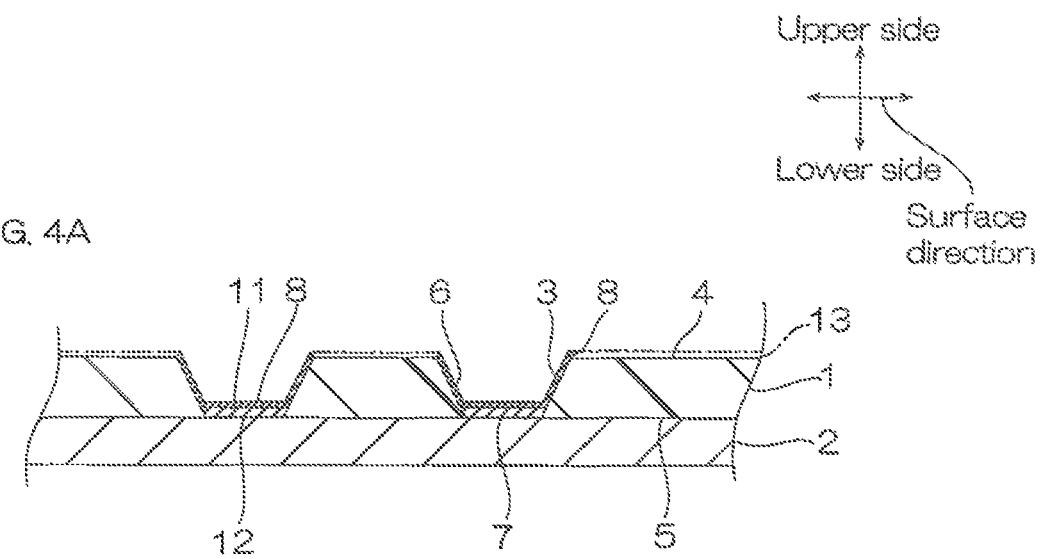
FIG. 4A and FIG. 4B show a modified example of the embodiment shown in FIG. 1A to FIG. 1F, corresponding to FIG. 1D to FIG. 1F, FIG. 4A illustrating a third step, in which a second barrier layer is formed, FIG. 4B illustrating a fourth step, in which a conductor layer is formed, a sixth step, in which an insulating cover layer is formed, and a fifth step, in which a metal plate is removed.
Figure 4B:
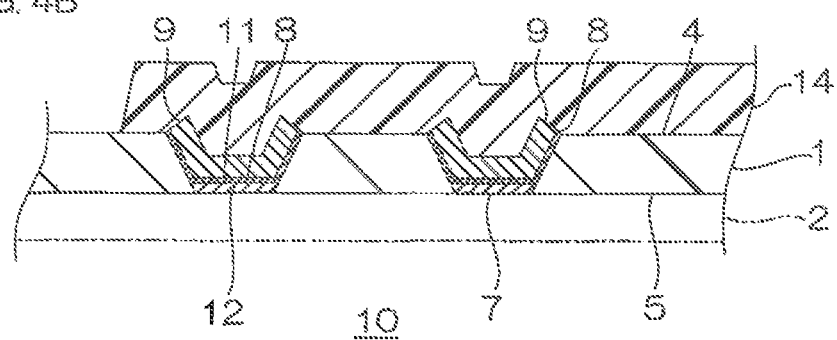

Thereafter, as shown in the solid line of FIG. 4A and FIG. 4B, the conductor layer 9 is formed, and then the insulating cover layer 14 is sequentially formed, and the metal plate 2 shown with the phantom line in FIG. 4B is removed.

In the first embodiment, as shown in FIG. 1A, the opening 3 is formed on the insulating layer 1 so that the insulating inner surface 6 has a tapered shape. However, as shown in FIG. 5A, the opening 3 can be formed at the insulating layer 1 so that the insulating inner surface 6 has a straight shape along the thickness direction.

Thereafter, the first barrier layer 7 is formed, and then as shown in FIG. 5B, the second barrier layer 8 (continuous layer 13 (phantom line) to be the second barrier layer 8), and then as shown in FIG. 5C, the conductor layer 9 is formed, and then the insulating cover layer 14 (phantom line) is formed, and thereafter, the metal plate 2 is removed.

Figure 6A:
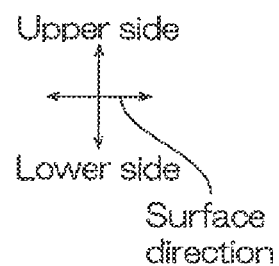
FIG. 6A and FIG. 6B are a modified example of the embodiment shown in FIG. 1A to FIG. 1F, corresponding to FIG. 1C to FIG. 1F, FIG. 6A illustrating a step, in which an intervening layer is formed, and a third step, in which a second barrier layer (continuous layer) is formed, FIG. 6B illustrating a fourth step, in which a conductor layer is formed, and a sixth step, in which an insulating cover layer is formed, and a fifth step, in which a metal plate is removed.
Figure 6A:
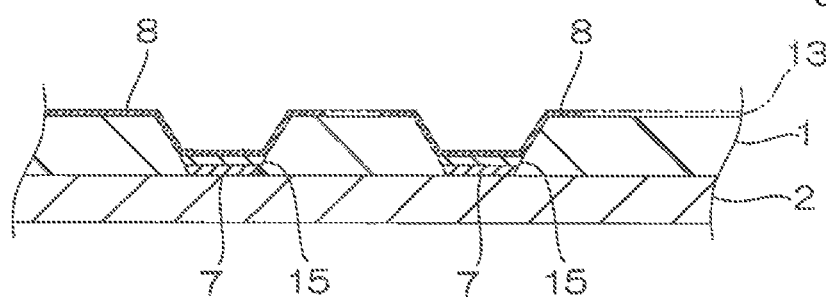

As shown in FIG. 6A, the intervening layer 15 can be disposed (intervened) between the first barrier layer 7 and the second barrier layer 8 in the opening 3.

The intervening layer 15 is formed on the entire first upper face 11 of the first barrier layer 7. The intervening layer 15 has a generally circular plate shape extending in the surface direction. For the material of the intervening layer 15, for example, metal such as nickel is used. The intervening layer 15 has a thickness of, for example, 0.1 μm or more, preferably 0.5 μm or more, and for example, 25 μm or less, preferably 10 μm or less.

The intervening layer 15 is formed between the second step and third step. The intervening layer 15 is formed by a thin film forming method of, for example, sputtering, plating (electrolytic plating, etc.). Preferably, the intervening layer 15 is formed by plating. To be specific, the intervening layer 15 is formed on the first upper face 11 of the first barrier layer 7 after the second step by plating.

Thereafter, in the third step, the continuous layer 13 to be the second barrier layer 8 is formed continuously on the upper face of the intervening layer 15, insulating inner surface 6, and the insulating upper face 4 of the insulating layer 1 surrounding the opening 3.

Figure 6B:
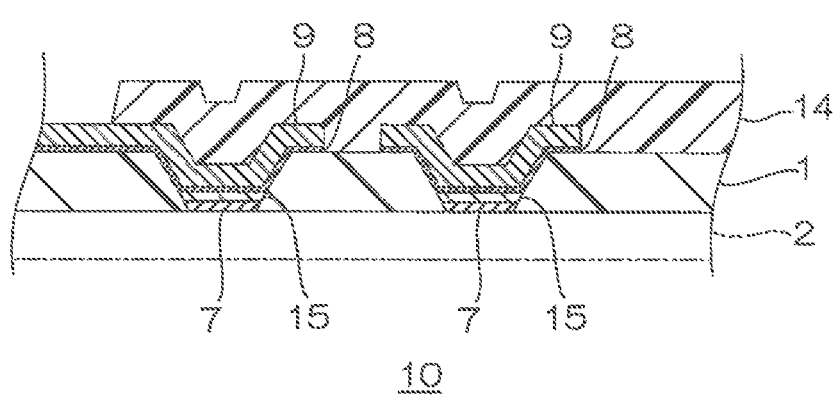

Thereafter, as shown in FIG. 6B, the conductor layer 9 and the second barrier layer 8 are formed, and then the insulating cover layer 14 is formed, and thereafter, the metal plate 2 shown with the phantom line is removed.

In this manner, as shown with the solid line of FIG. 6B, the wired circuit board 10 including the insulating base layer 1, first barrier layer 7, intervening layer 15, second barrier layer 8, conductor layer 9, and insulating cover layer 14 is produced.

Figure 7A:
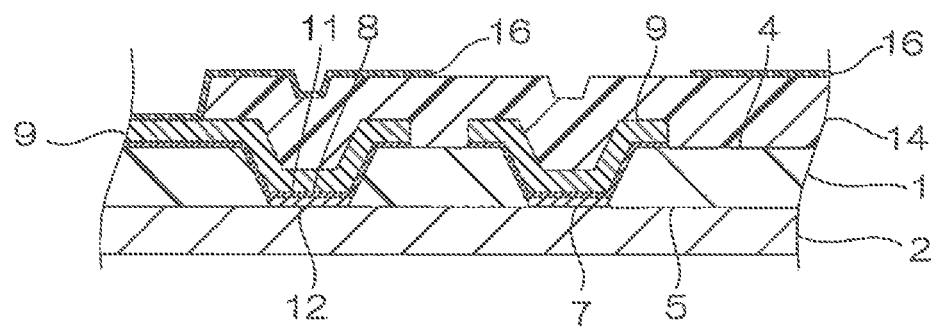
FIG. 7A and FIG. 7B show modified example of the embodiment shown in FIG. 1A to FIG. 1F, FIG. 7A illustrating a step in which a shield layer is formed, FIG. 7B illustrating a step in which a second insulating cover layer is formed, and a fifth step, in which a metal plate is removed.
Figure 7B:
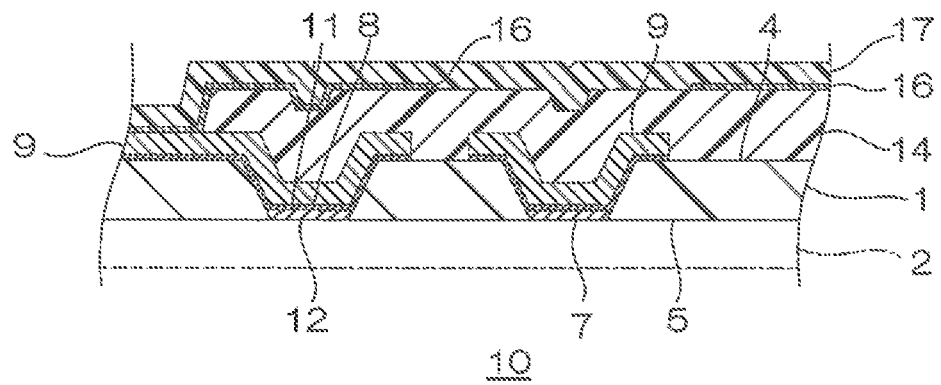

As shown in FIG. 7A and FIG. 7B, the shield layer 16 and the second insulating cover layer 17 can be further included in the wired circuit board 10.

As shown in FIG. 7A, the shield layer 16 is provided on the upper face of the insulating cover layer 14, and the upper face of the conductor layer 9 exposed from the insulating cover layer 14. The pattern, forming method, and thickness of the shield layer 16 are not particularly limited. The material of the shield layer 16 is the same as the material of the conductor layer 9.

As shown in FIG. 7B, the second insulating cover layer 17 is provided on the upper face of the insulating cover layer 14 so as to cover the shield layer 16. The pattern, and forming method of the second insulating cover layer 17 is not particularly limited. The material and the thickness of the second insulating cover layer 17 are the same as those of the insulating cover layer 14.

In this method, as shown in FIG. 7A, after the sixth step (ref: FIG. 1E), the shield layer 16 is formed, and then as shown in FIG. 7B, the second insulating cover layer 17 is formed, and thereafter, the metal plate 2 shown by the phantom line in FIG. 7 is removed (fifth step).

The wired circuit board 10 includes the insulating base layer 1, first barrier layer 7, second barrier layer 8, conductor layer 9, insulating cover layer 14, shield layer 16, and second insulating cover layer 17.

In the first embodiment, the wired circuit board 10 is described as the wired circuit board for an imaging device, and its use is not limited thereto, and for example, it can be used as a board for inspection (anisotropic electrical conductive sheet), and a flexible wired circuit board.

While the illustrative embodiments of the present invention are provided in the above description, such is for illustrative purpose only and it is not to be construed as limiting in any manner Modification and variation of the present invention that will be obvious to those skilled in the art is to be covered by the following claims.

INDUSTRIAL APPLICABILITY

The wired circuit board is included in the imaging device.

DESCRIPTION OF REFERENCE NUMERALS 1 insulating layer
2 metal plate
3 opening
4 insulating upper face
6 insulating inner surface
7 first barrier layer
8 second barrier layer
9 conductor layer 10 wired circuit board (wired circuit board for an imaging device)
11 first upper face
22 imaging device
23 imaging element

The invention claimed is:

1. A wired circuit board comprising:
an insulating layer having an opening penetrating in a thickness direction of the insulating layer,
a first barrier layer positioned at one end edge in a thickness direction of the opening and flush with one side surface in the thickness direction of the insulating layer, the first barrier layer being positioned at the one end edge in the thickness direction of the opening so as to take up only a portion of the opening in the thickness direction of the opening as compared to a thickness of the insulating layer,
a second barrier layer disposed continuously at one side in a thickness direction of the first barrier layer, the inner, side wall surface of the insulating layer which forms the opening, and one side surface in the thickness direction of the insulating layer surrounding the opening, and
a conductor layer disposed at one side surface in a thickness direction of the second barrier layer and contacts the second barrier layer.

2. The wired circuit board according to claim 1, wherein the inner, side wall surface of the insulating layer has a tapered shape inclining relative to the thickness direction of the insulating layer.

3. The wired circuit board according to claim 1, wherein the conductor layer has a thickness of 12 μm or less.

4. An imaging device comprising:
the wired circuit board according to claim 1, and
an imaging element mounted on the wired circuit board, and electrically connected with the conductor layer.

5. The wired circuit board of claim 1, wherein the first barrier layer has a thickness of 0.05 μm or more and 5 μm or less.

6. The wired circuit board of claim 1, wherein the first barrier layer has a thickness of 0.2 μm or more and 5 μm or less.

7. The wired circuit board of claim 1, wherein the insulating layer has a thickness of 1 μm or more and 30 μm or less.

* * * * *